United States Patent
Kremer et al.

(10) Patent No.: US 11,709,198 B2
(45) Date of Patent: Jul. 25, 2023

(54) METHOD FOR LINE ASSIGNMENT OF A SHORT-CIRCUIT OF A BROADBAND LAMBDA SENSOR

(71) Applicant: Robert Bosch GmbH, Stuttgart (DE)

(72) Inventors: Stefan Kremer, Korntal-Muenchingen (DE); Bernhard Ledermann, Weil Der Stadt (DE); Fabian Baumann, Affalterbach (DE)

(73) Assignee: Robert Bosch GmbH, Stuttgart (DE)

( * ) Notice: Subject to any disclaimer, the term of this patent is extended or adjusted under 35 U.S.C. 154(b) by 18 days.

(21) Appl. No.: 17/462,074

(22) Filed: Aug. 31, 2021

(65) Prior Publication Data

US 2022/0065922 A1    Mar. 3, 2022

(30) Foreign Application Priority Data

Aug. 31, 2020   (DE) .......................... 102020210925.7

(51) Int. Cl.
  *G01R 31/52*   (2020.01)
  *G01R 31/28*   (2006.01)
  *G01M 15/10*   (2006.01)

(52) U.S. Cl.
  CPC ....... *G01R 31/2829* (2013.01); *G01M 15/104* (2013.01); *G01R 31/52* (2020.01)

(58) Field of Classification Search
  CPC .............................. G01R 31/52; G01R 31/2829
  See application file for complete search history.

(56) References Cited

U.S. PATENT DOCUMENTS

| | | | |
|---|---|---|---|
| 10,591,453 B2* | 3/2020 | Hasse | G01N 27/41 |
| 2004/0153258 A1* | 8/2004 | Kurokawa | G01N 27/4175 702/32 |
| 2005/0288847 A1* | 12/2005 | Inoue | G01N 27/4175 123/688 |

(Continued)

FOREIGN PATENT DOCUMENTS

| | | |
|---|---|---|
| DE | 10056320 A1 | 5/2002 |
| DE | 102011077171 A1 | 11/2012 |

(Continued)

*Primary Examiner* — Patrick Assouad
*Assistant Examiner* — Demetrius R Pretlow
(74) *Attorney, Agent, or Firm* — Michael Best & Friedrich LLP

(57) ABSTRACT

A method for line assignment of a short-circuit of a broadband lambda sensor having an upper or a lower short-circuit potential, wherein the broadband lambda sensor has a sensor and multiple sensor lines. The method comprises establishing a conductive connection of at least one sensor line of the multiple sensor lines via a limiting resistor to a reference potential; comparing a sensor line potential of at least one sensor line to be checked of the multiple sensor lines to the reference potential or the short-circuit potentials; classifying (105) the at least one sensor line to be checked as not short-circuited with the upper or the lower short-circuit potential if it is established upon the comparison that the at least one sensor line potential is inside the reference potential range or if it is outside the short-circuit potential ranges; and assigning the short-circuit to at least one sensor line not classified as not short-circuited.

10 Claims, 4 Drawing Sheets

(56) References Cited

U.S. PATENT DOCUMENTS

| | | | |
|---|---|---|---|
| 2007/0273540 A1* | 11/2007 | Inoue | G01N 27/407 |
| | | | 702/116 |
| 2009/0084172 A1* | 4/2009 | Fukagai | G01N 27/4175 |
| | | | 73/114.72 |
| 2012/0293183 A1* | 11/2012 | Ledermann | G01N 27/4065 |
| | | | 324/543 |
| 2013/0186169 A1* | 7/2013 | Bevot | G01N 27/4175 |
| | | | 73/1.06 |
| 2013/0234744 A1* | 9/2013 | Carbonaro | F02D 41/1495 |
| | | | 324/750.03 |
| 2014/0278013 A1* | 9/2014 | Gibson | F02D 41/1494 |
| | | | 324/537 |
| 2015/0047411 A1* | 2/2015 | Ledermann | G01N 33/007 |
| | | | 73/1.06 |
| 2016/0097737 A1* | 4/2016 | Higuchi | G01N 27/4175 |
| | | | 204/401 |
| 2019/0195828 A1* | 6/2019 | Knoefler | G01N 27/4175 |
| 2021/0348575 A1* | 11/2021 | Wagner | F01N 11/00 |

FOREIGN PATENT DOCUMENTS

| | | |
|---|---|---|
| DE | 102014226922 A1 | 2/2016 |
| DE | 102015011931 A1 | 4/2016 |
| DE | 102018215887 A1 | 3/2020 |

* cited by examiner

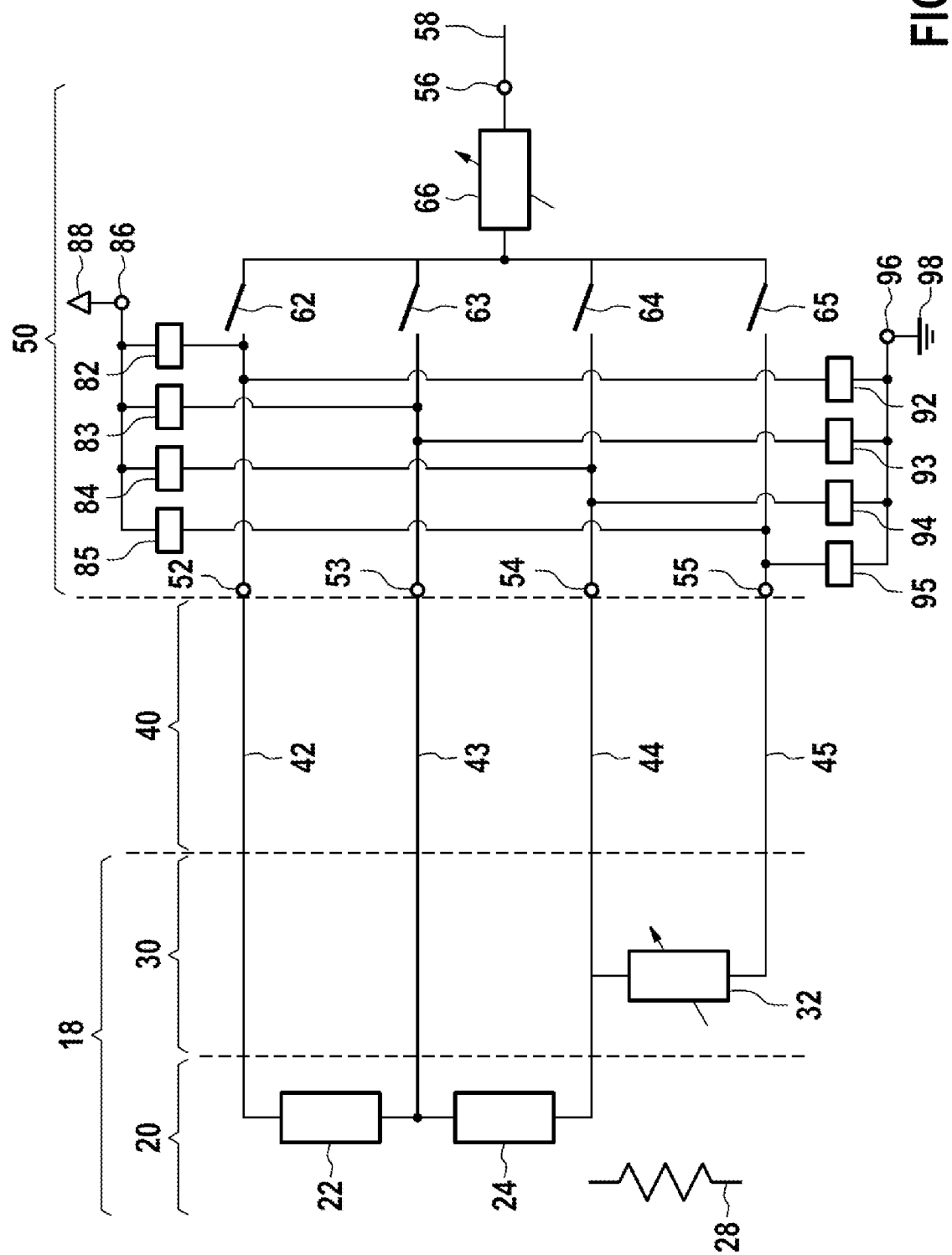

METHOD FOR LINE ASSIGNMENT OF A SHORT-CIRCUIT OF A BROADBAND LAMBDA SENSOR

BACKGROUND OF THE INVENTION

The present invention relates to a method for line assignment of a short-circuit of a broadband lambda sensor and an evaluation circuit, a processing unit, and a computer program for carrying out the method.

Broadband lambda sensors are used to determine the oxygen content in exhaust gases of a combustion process relative to the oxygen content of the ambient air, the corresponding measured value is denoted by λ. For this purpose, the electrical voltage of a Nernst cell or the electrical resistance of a resistance jump probe can be measured in the lambda sensor. Broadband lambda sensors are especially used in the exhaust system of internal combustion engines, where they are also known, above all in English usage, as UEGO sensors (Universal Exhaust-Gas Oxygen sensors) or lambda sensors of the UEGO type. Such broadband lambda sensors comprise multiple sensor lines, via which the sensor is connected to a control unit.

The λ measured values acquired by a broadband lambda sensor, i.e., the oxygen content in the combustion exhaust gas, are used by a controller, for example, an engine control unit that controls an internal combustion engine of a motor vehicle, to control the combustion process so that in particular the pollutant content in the exhaust gas is as low as possible. Occurring short-circuits, for example with a battery or with ground, result in incorrect λ measured values and thus also incorrect control of the combustion process, so that, for example, excess fuel consumption occurs or legal requirements for pollutant emission are not observed.

Short-circuit errors can be assigned to upper overflow or to lower overflow, for example, to battery or ground. It can also be distinguished whether a supply line to a heating element of the broadband lambda sensor or a sensor line is affected. An assignment of a short-circuit, sometimes desired by authorities, to a single one of the multiple sensor lines in the hot state is not known, however.

SUMMARY OF THE INVENTION

According to the invention, a method for line assignment of a short-circuit of a broadband lambda sensor and an evaluation circuit, a processing unit, and a computer program for carrying out the method.

The invention makes use of the measure of connecting at least one sensor line of a broadband lambda sensor via a limiting resistor to a reference potential applied to a reference potential terminal. The potential at sensor lines which are not short-circuited is "drawn away" by the reference potential from the lower or upper short-circuit potential. According to the invention, sensor lines in which this succeeds are classified or determined as "not short-circuited". In sensor lines in which this does not succeed, i.e., which are not determined as "not short-circuited", a short-circuit can then be concluded, which can be direct or indirect, i.e., via a measurement resistor of the broadband lambda sensor. The method according to the invention enables, by exclusion of not short-circuited sensor lines, the identification of the line which is short-circuited with an upper short-circuit potential (for example a supply voltage source) or with a lower short-circuit potential (for example a ground), so that the short-circuit can be assigned to a sensor line of the broadband lambda sensor. Repairs can thus be simplified and accelerated and repair costs can be saved.

To recognize whether "drawing away" the sensor line potentials from the short-circuit potentials is successful, the sensor line potential resulting on the at least one sensor line to be checked can be compared to the reference potential, on the one hand, and the short-circuit potentials, on the other hand. In both cases, the comparison can be carried out by means of comparators.

The two solutions do not exclude one another, but rather they can also be combined. In particular, it is possible to use different reference potentials and different limiting resistors, for example, first/second reference potentials and first/second limiting resistors, wherein this nomenclature is dispensed with in the following for the sake of simplicity, since it is not necessary for implementing the inventive concept. If both solutions are used jointly, one reference potential (in particular the first) is preferably in the lower third of the potential range between lower and upper short-circuit potential and the other reference potential (in particular the second) is in the upper third of the potential range between lower and upper short-circuit potential, so that one reference potential enables a clearer separation from the upper short-circuit potential and the other reference potential enables a clearer separation from the lower short-circuit potential. In the case of different reference potentials and/or limiting resistors, the two solutions are not carried out at the same time, but at different times, for example alternately.

The broadband lambda sensor has multiple sensor lines, preferably at least two, which are each connected to a terminal, in particular at least one terminal selected from a reference electrode terminal RE, an inner pump electrode terminal IPE, an outer pump electrode terminal APE, and a measurement terminal MES. Reference electrode terminal RE and pump electrode terminal APE can also be formed jointly. The sensor lines can be connected to one another via internal resistors of the broadband lambda sensor, which are formed by Nernst cells or resistors of a resistance jump sensor. The connection of a sensor line to the reference potential terminal can take place via a limiting resistor to avoid excessively high currents in case of short-circuit. The limiting resistor determines or limits the current which, if the sensor line is short-circuited, can flow between the upper/lower short-circuit potential and the reference potential.

The upper short-circuit potential can be the voltage of a voltage or power supply, for example, a battery of a motor vehicle. The lower short-circuit potential can be a ground or earth potential. If a sensor line is not short-circuited, its sensor line potential is drawn to the reference potential. If the sensor line is short-circuited, this is not the case, but rather the short-circuit potential is applied on the sensor line and a voltage drop occurs over the limiting resistor, which can be recognized upon comparison.

The short-circuit of the at least one sensor line with the upper or the lower short-circuit potential can be direct or indirect, wherein an indirect short-circuit is to be understood to mean that the corresponding sensor line is connected indirectly, via one of the internal resistors of the broadband lambda sensor or a trimming resistor, to another sensor line, which is in turn itself short-circuited directly (with low resistance, i.e., only via conductors without interconnected resistors) with the upper short-circuit potential or the lower short-circuit potential.

Heating the sensor before beginning the measurement to a measurement temperature, for example, 500° C. or more, can also be provided, i.e., the invention is not restricted to use in a cold sensor, in particular the invention can be executed starting from a broadband lambda sensor at operating temperature for example, if a short-circuit is established during operation and a line assignment is to take place as quickly as possible. The heating is carried out, for example, by a heating element contained in the broadband lambda sensor. The respective specified temperature of the sensor is to be kept constant during the method steps, unless the temperature is possibly changed (cooled) in the context of one preferred embodiment (see below) as an explicit method step. The test temperature reached during heating is preferably at least 600° C., or preferably at least 700° C. The test temperature reached during heating is preferably in the range of 600° C. to 900° C.

The terms "connection", "connecting", and the like are to be understood in the context of this application in the meaning of an "electrically conductive connection" or of "electrically conductively connecting." The terms "connection", "connecting", "conductive connection", "conductively connecting", and the like are used only for simplification and better readability but are to be understood in the meaning of electrically conductive.

The reference potential is between the upper and the lower short-circuit potential, specifically so that the reference potential range defined around the reference potential is also completely between the upper and the lower short-circuit potential, more precisely between the upper short-circuit potential range and the lower short-circuit potential range. The upper and the lower short-circuit potential range can be defined as potential ranges which deviate by less than a respective predetermined voltage amount from the upper or lower short-circuit potential. The predetermined voltage amount can be specified as an absolute value, e.g., 0.01 V, 0.02 V, 0.05 V, 0.1 V, 0.2 V, 0.5 V, or 1 V. If it is established upon the comparison that a sensor line potential to be checked is outside these ranges, the corresponding sensor line is classified as not short-circuited, otherwise the corresponding sensor line can be considered to be short-circuited.

Similarly, the reference potential range can be defined as a potential range around the reference potential, which includes all potentials which deviate by less than a predetermined voltage amount from the reference potential. The predetermined voltage amount can be given here as an absolute value, e.g., 0.1 V, 0.2 V, 0.5 V, or 1 V, or as a relative value, e.g., 2%, 5%, 10%, or 20% of the reference potential. It is thus established by the comparison whether the sensor line potential is "essentially" equal or unequal to the reference potential, the reference potential range defines what is to be understood under "essentially".

The method preferably comprises, for the at least one sensor line to which the short-circuit is assigned, a determination that a short-circuit with the upper short-circuit potential is present if it is established upon the comparison that the corresponding sensor line potential (of the sensor line assigned to the short-circuit) is in the upper short-circuit potential range or above the reference potential range; and a determination that a short-circuit with the lower short-circuit potential is present if it is established upon the comparison that the corresponding sensor line potential (of the sensor line assigned to the short-circuit) is in the lower short-circuit potential range or below the reference potential range. The knowledge of whether a short-circuit is present with the upper or lower short-circuit potential can be helpful in the error search.

The at least one sensor line to be checked preferably includes one or more non-connected sensor lines. This is advantageous, for example, in a broadband lambda sensor having at least three sensor lines, wherein a first sensor line is short-circuited, a second sensor line is connected to the reference potential, and a third, non-connected sensor line is the sensor line to be checked. The potential of the third sensor line is then drawn via a measurement resistor between second and third sensor line in the direction of the reference potential. It can thus be recognized that the third sensor line is not short-circuited without this having to be connected itself (only via the limiting resistor) to the reference potential.

Furthermore, the at least one sensor line to be checked includes all of the multiple sensor lines. Thus, independently of which of the sensor lines is connected, all sensor lines are checked as to whether drawing their potential away from the short-circuit potentials is successful or whether they are short-circuited. In this way, non-short-circuited sensor lines can be recognized quickly.

The method preferably furthermore comprises repeating the above-described method steps, wherein in the step of establishing a conductive connection of at least one sensor line, sensor lines other than the at least one sensor line, which is connected via the limiting resistor to the reference potential, are selected. Thus, a different, new set of sensor lines to be connected is selected, wherein the new set can overlap the earlier set (or the earlier sets if multiple repetitions take place) of sensor lines to be connected and it is also possible that one set is a (real) subset of the other.

Preferably, each of the sensor lines is connected in series or different subsets of multiple of the sensor lines are connected via the limiting resistor to the reference potential and disconnected again after a predetermined time span; wherein for each sensor line or subset, a checking point in time is provided within the predetermined time span in which the respective sensor line or subset is connected to the reference potential, at which the at least one sensor line to be checked includes the respective connected sensor line or subset or preferably is this; and wherein the steps of comparing and classifying are carried out multiple times, namely at the respective checking points in time. This enables individual sensor lines to be tested for a short-circuit and ideally non-short-circuited lines and a single (directly) short-circuited line to be identified as quickly as possible.

The method preferably comprises, if more than one sensor line is determined to be short-circuited with the upper and the lower short-circuit potential, at least one of changing the temperature of the sensor, in particular cooling the sensor, changing the limiting resistor, in particular reducing the limiting resistor, and/or changing the reference potential. Furthermore, the method then comprises repeating the method steps according to one of the above-mentioned embodiments. If the temperature of the sensor is changed, this furthermore preferably takes place by a predetermined temperature difference in the range of 25° C. to 100° C., still more preferably in the range of 25° C. to 50° C. Indirectly short-circuited sensor lines can thus be excluded from the result. These method steps are therefore preferably repeated until precisely one sensor line (namely the directly short-circuited one) is assigned to the short-circuit, i.e., is determined to be short-circuited with the upper and the lower short-circuit potential.

Cooling is preferably carried out in that a certain time is waited out until the sensor cools to the changed test temperature. Alternatively, active cooling, for example using cool air, is also conceivable. It is possible here to fall below the temperature of at least 500° C. mentioned above in the possible step of heating.

The evaluation circuit according to the invention for the line assignment of a short-circuit of a broadband lambda sensor, which has a sensor and multiple sensor lines, comprises a reference potential terminal; in each case one sensor line terminal for each of the sensor lines; a limiting resistor which is connected to the reference potential terminal; in each case one switch for each of the sensor lines, wherein each of the switches is connected to a sensor line terminal and via the limiting resistor to the reference potential terminal (i.e., one terminal of the limiting resistor is connected to the reference potential terminal and the other terminal of the limiting resistor is connected to the switches; or the two terminals of a switch are connected, on the one hand, to one of the sensor line terminals and, on the other hand, to the limiting resistor), and is configured to establish or disconnect a conductive connection between the respective sensor line terminal and the reference potential terminal (i.e., to switch back and forth between a conductive and a nonconductive connection); and at least one comparator for the sensor lines which is configured to compare a sensor line potential applied to the respective sensor line to the lower and/or upper short-circuit potential or the reference potential. More precisely, in the first solution the at least one comparator is configured to compare a sensor line potential applied to the respective sensor line to a potential (upper short-circuit potential) applied to an upper short-circuit potential terminal and/or a potential (lower short-circuit potential) applied to a lower short-circuit potential terminal. In the second solution, the at least one comparator is configured to compare a sensor line potential applied to the respective sensor line to a potential (reference potential) applied to the reference potential terminal.

The evaluation circuit enables, when suitably controlled (for example by a control unit), the method according to the invention to be implemented, wherein the switches are used for establishing and disconnecting the connection of the sensor lines to the limiting resistor or the reference potential and the at least one comparator is used for comparing the potentials.

According to one preferred embodiment, which permits simultaneous measurement, a separate comparator is provided for each of the sensor lines, wherein, for example, each comparator is connected to the associated sensor line terminal and the lower or upper short-circuit potential terminal or reference potential terminal.

The limiting resistor of the evaluation circuit is preferably changeable. The division ratio of the voltage divider, which is formed in the case of an indirect short-circuited by the limiting resistor and an internal resistance of the broadband lambda sensor, can thus be changed.

A processing unit according to the invention, for example, a control unit of a motor vehicle, which preferably comprises an evaluation circuit according to the invention is configured, in particular by programming, to carry out a method according to the invention.

The implementation of a method according to the invention in the form of a computer program or computer program product having program code for carrying out all method steps is also advantageous, since this causes particularly low costs, in particular if an executing control unit is also used for other tasks and is therefore provided in any case. Suitable data carriers for providing the computer program are in particular magnetic, optical, and electrical memories, e.g., hard drives, flash memories, EEPROMs, DVDs, etc. A download of a program via computer networks (Internet, intranet, etc.) is also possible.

Further advantages and embodiments of the invention result from the description and the appended drawings.

The invention is schematically illustrated on the basis of exemplary embodiments in the drawings and is described hereinafter with reference to the drawings.

BRIEF DESCRIPTION OF THE DRAWINGS

FIG. 2A shows an evaluation circuit according to one preferred embodiment of the invention;

DETAILED DESCRIPTION

Figure 1:
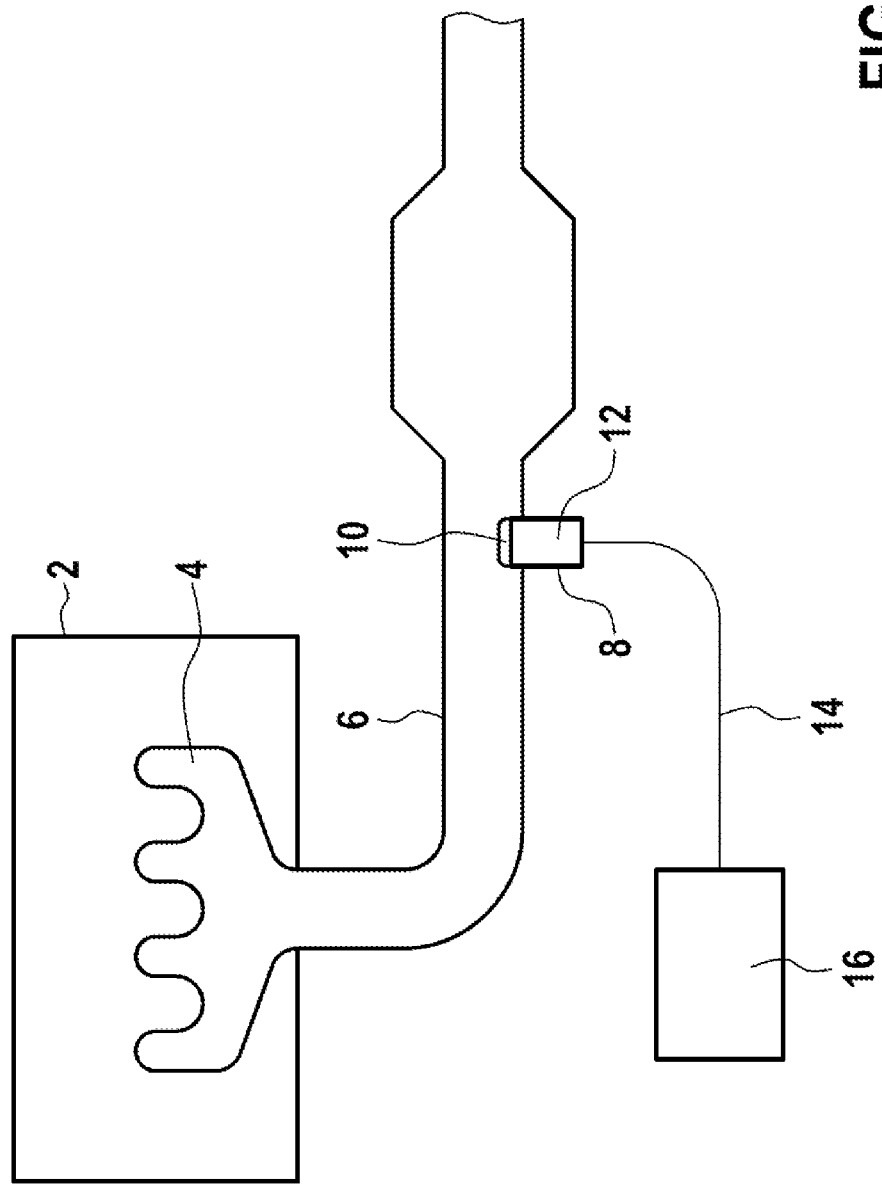
FIG. 1 shows by way of example the arrangement of a lambda sensor in the exhaust gas system of an internal combustion engine.

FIG. 1 illustrates by way of example a typical arrangement of a lambda sensor in the exhaust gas system of an internal combustion engine 2. The combustion exhaust gases of the internal combustion engine 2 are supplied via an exhaust manifold 4 to an exhaust pipe 6. A lambda sensor 8, for example a broadband lambda sensor, is inserted into an opening in the wall of the exhaust pipe 6, so that a sensor 10 of the lambda sensor 8 protrudes into the exhaust gas flow. The lambda sensor 8 furthermore has a plug 12, by means of which in particular the lambda sensor 8 is fastened, for example, screwed, onto the exhaust pipe 6. The lambda sensor 8 is connected via a cable 14 to a control unit 16. Sensor lines extend in the cable 14, by means of which the measured values of the lambda sensor 8 are ascertained, and possibly further lines, in particular lines which supply a heating element, which is used to heat up the lambda sensor 8, with current. The control unit 16 can be an engine control unit which controls the internal combustion engine 2 (via control lines (not shown)) in consideration of the measured values of the oxygen content in the exhaust gas obtained by the lambda sensor, for example, its fuel supply or air supply.

Lambda sensors based on Nernst cells use the effect that, for example, zirconium dioxide, $ZrO_2$, can electrolytically transport oxygen ions at temperatures from approximately 350° C., whereby a voltage between external electrodes connected to sensor lines arises on zirconium membranes made of zirconium dioxide in the event of a difference in the oxygen concentration between both sides of the zirconium membrane. This oxygen ion conductivity increases with increasing temperature, the corresponding resistance of the zirconium membrane decreases. Known broadband lambda sensors having two cells comprise in principle two zirconium membranes, wherein one zirconium membrane is used as a Nernst probe, the sudden voltage change of which in the event of different oxygen concentrations on both sides of the membrane is used as a control signal for a pump current made up of oxygen ions flowing through the second zirconium membrane to set a gas located between the two membranes to an oxygen content of $\lambda=1$ (i.e., the oxygen content of the gas is equal to the oxygen content of the ambient air). The dimension of the pump current correlates with the lambda value (oxygen content of the exhaust gas) to be measured. In addition to zirconium dioxide, other materials can also be used for lambda sensors.

Figure 2B:
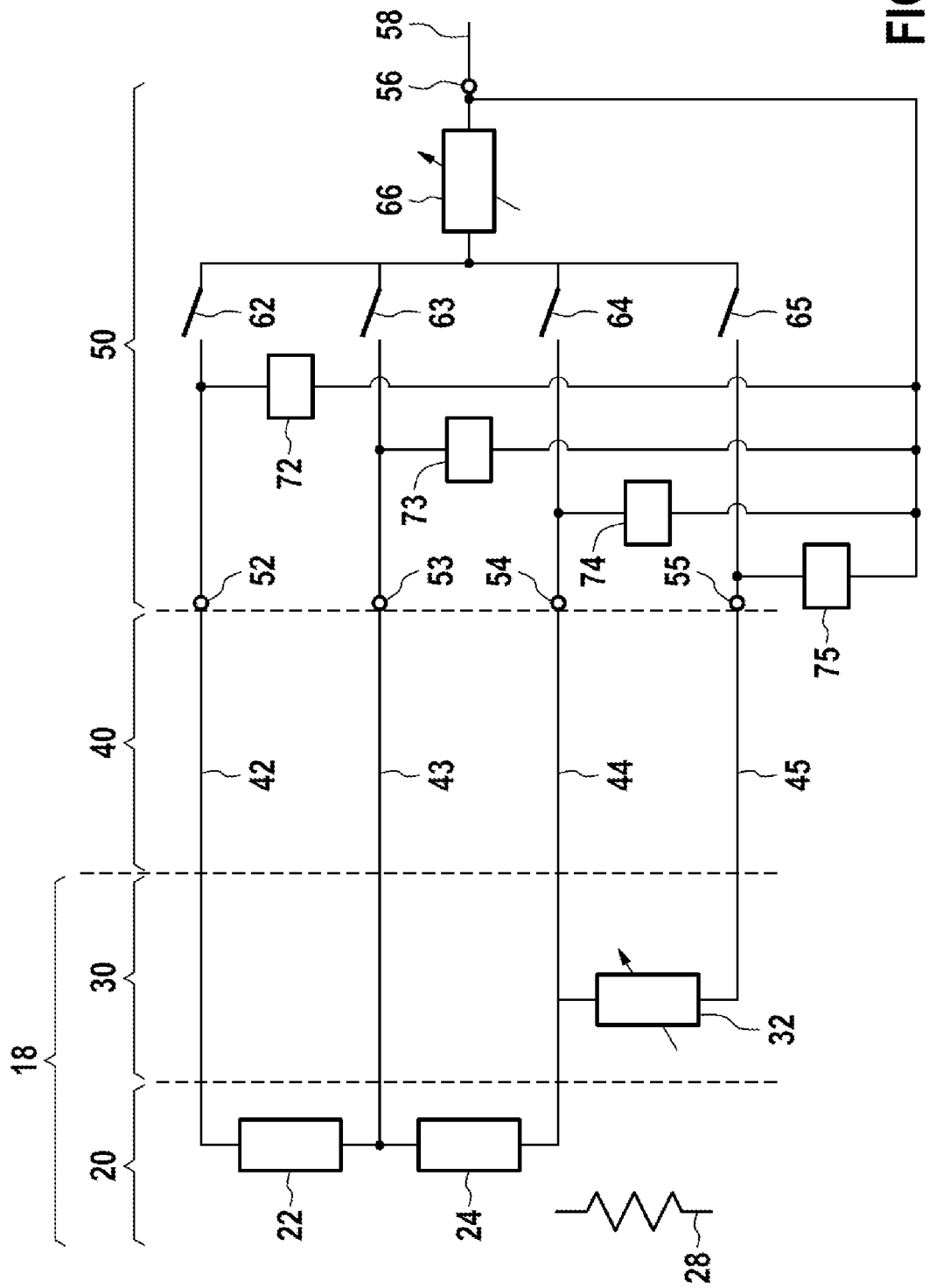
FIG. 2B shows an evaluation circuit according to another preferred embodiment of the invention.

FIGS. 2A and 2B illustrate arrangements which, inter alfa, comprise an evaluation circuit according to a preferred embodiment of the invention. The figures are described jointly, wherein the differences are pointed out. In both figures, a broadband lambda sensor 18 having a sensor 20 and a plug 30 is shown, which is connected via a cable 40 to the evaluation circuit 50. The broadband lambda sensor 18 can be used as a lambda sensor 8 corresponding to the arrangement of FIG. 1, in particular the evaluation circuit can be included in a control unit which is connected via the cable to the broadband lambda sensor.

The sensor 20 of the broadband lambda sensor 18 comprises, for example, two Nernst cells, which in circuitry form two resistors 22, 24, referred to hereinafter as probe resistors, between sensor lines. More precisely, a first Nernst cell forms a first probe resistor 22 between a first sensor line 42 and a second sensor line 43 and a second Nernst cell forms a second probe resistor 24 between the second sensor line 43 and a third sensor line 44.

The broadband lambda sensor 18 expediently comprises a heating element 28 (shown here by way of example as part of the sensor 20), using which the sensor 20 can be heated to reach the temperature necessary for its function. Associated power supply lines (not shown) for the heating element can also extend through the cable.

The broadband lambda sensor 18 furthermore comprises by way of example a changeable third resistor 32 arranged in the plug 30, referred to hereinafter as a trimming resistor, which is used in particular for calibrating the broadband lambda sensor. The trimming resistor 32 is connected between the third sensor line 44 and a fourth sensor line 45.

The sensor lines 42, 43, 44, 45 are led through the cable 40 and extend starting from the broadband lambda sensor 18 to corresponding terminals 52, 53, 54, 55, referred to hereinafter as sensor line terminals, on the evaluation circuit 50. These terminals are typically also referred to as reference electrode terminal RE (52), inner pump electrode terminal IPE (53), outer pump electrode terminal APE (54), and measurement terminal MES (55).

The respective evaluation circuit 50, which can be contained, for example, in a control unit, has in both embodiments a sensor line terminal 52, 53, 54, 55 for each of the sensor lines 42, 43, 44, 45 and a reference potential terminal 56, i.e., a terminal at a reference potential 58. Each of the sensor line terminals 52, 53, 54, 55 is connectable via a respective switch 62, 63, 64, 65 via a resistor 66, referred to hereinafter as a limiting resistor, to the reference potential terminal 56, wherein the switches are configured both to establish the connection (by closing the respective switch) and also to disconnect it (by opening the respective switch). I.e., each of the switches closes and disconnects a conductive connection between the associated sensor line terminal and one terminal of the limiting resistor, the other terminal of the limiting resistor is connected to the reference potential terminal. The limiting resistor 66 is preferably changeable (as shown).

For the embodiment shown in FIG. 2A, the evaluation circuit 50 furthermore comprises, for each of the sensor lines 42, 43, 44, 45 or the corresponding sensor line terminal 52, 53, 54, 56, respectively, an (upper) comparator 82, 83, 84, 85, which enables a comparison to the upper short-circuit potential 88 (for example supply voltage) applied to an upper short-circuit potential terminal 86, and a (lower) comparator 92, 93, 94, 95, which enables a comparison to the lower short-circuit potential 98 (for example ground) applied to a lower short-circuit potential terminal 96. Each of the (upper) comparators 82, 83, 84, 85 is connected, on the one hand, to the upper short-circuit potential terminal 86 and, on the other hand, to the corresponding sensor line terminal 52, 53, 54, 56. Each of the (lower) comparators 92, 93, 94, 95 is connected, on the one hand, to the lower short-circuit potential terminal 86 and, on the other hand, to the corresponding sensor line terminal 52, 53, 54, 56.

The upper comparators 82, 83, 84, 85 are configured to establish upon the comparison whether a sensor line potential applied on the respective sensor line terminal 52, 53, 54, 56 is inside or outside an upper short-circuit potential range, which is defined around the potential (upper short-circuit potential 88) applied to the upper short-circuit potential terminal 86. The lower comparators 92, 93, 94, 95 are configured to establish upon the comparison whether a sensor line potential applied to the respective sensor line terminal 52, 53, 54, 56 is inside or outside a lower short-circuit potential range, which is defined around the potential (lower short-circuit potential 98) applied to the lower short-circuit potential terminal 96. (It is to be noted that the terms "upper/lower" comparators are used solely to distinguish the comparators, in particular with regard to which short-circuit potential they refer to, no spatial arrangement or the like is thus to be implied.)

For the embodiment shown in FIG. 2B, the evaluation circuit 50 furthermore comprises, for each of the sensor lines 42, 43, 44, 45 or the corresponding sensor line terminal 52, 53, 54, 56, in each case a comparator 72, 73, 74, 75 or reference potential comparator. The inputs of each comparator are connected, on the one hand, to the sensor line terminal which is associated with the comparator and, on the other hand, to the supply or ground potential terminal 76 or 77, respectively. The comparators 72, 73, 74, 75 are configured to compare the potentials at the inputs, i.e., each comparator is configured to compare the sensor line potential which is applied to the sensor line associated with the comparator to the supply potential 76, i.e., the upper short-circuit potential, or ground potential 77, i.e., the lower short-circuit potential, respectively. More precisely, the comparators 72, 73, 74, 75 are configured to establish whether or not the sensor line potential on the corresponding sensor line is outside the reference potential range, i.e., whether the two potentials (sensor line potential, reference potential) differ by at least the predetermined voltage amount. The comparators are preferably furthermore configured to establish which of the two potentials is greater if it has been established that the two potentials differ from one another by at least the predetermined voltage amount.

Both embodiments of FIGS. 2A and 2B are suitable for simultaneously checking multiple or all sensor lines. In embodiments alternative thereto for an iterative check, one comparator (or two comparators in the case of an alternative embodiment to the embodiment of FIG. 2A) is sufficient in each case, which, on the one hand, taps the potential between the switches and the limiting resistor 66 and, on the other hand, taps the potential at the upper and/or lower short-circuit potential terminal 86, 96 or the reference potential terminal 56, respectively, and compares these potentials.

It is also possible to combine the embodiments of FIGS. 2A and 2B. The same reference potential terminal, the same limiting resistor, and the same switches can be used here for both embodiments, or alternatively in particular two different reference potential terminals, two different limiting resistors, and different switches (so that the two evaluation circuits can be operated independently of one another) can be provided in particular for both embodiments. The latter can be helpful if reference potentials are available in various potential ranges.

The switches and possibly the limiting resistor and/or the reference potential can be controlled according to the method according to the invention and the outputs of the comparators (comparison results) can be evaluated according to the method according to the invention by a control logic implemented as hardware and/or software, which can be contained, for example, in a control unit which comprises the evaluation circuit 50.

Figure 3:
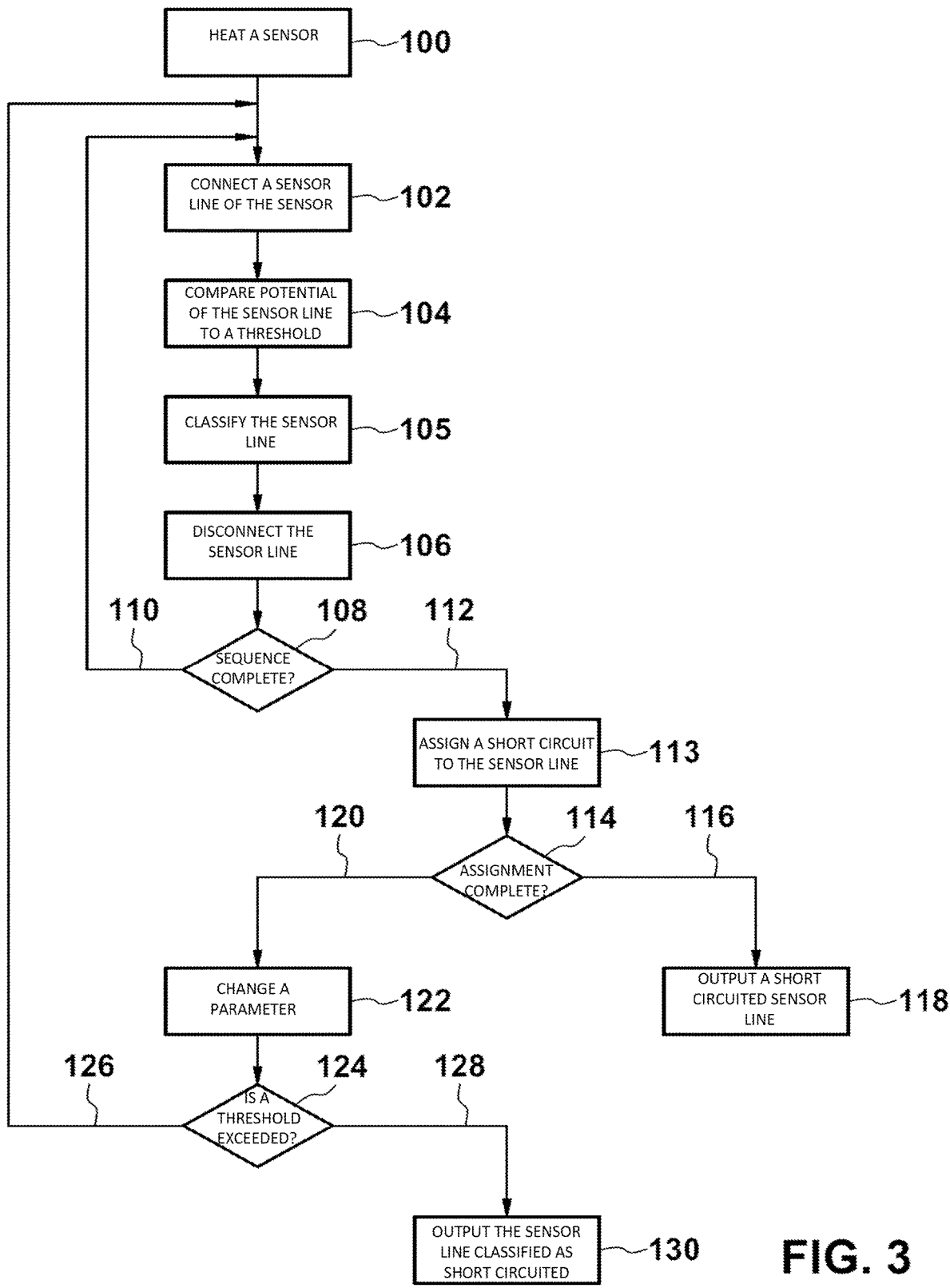
FIG. 3 shows a flow chart of the method according to the invention for line assignment of a short-circuit of a broadband lambda sensor according to one preferred embodiment.

FIG. 3 illustrates the sequence according to one preferred embodiment of the method according to the invention for line assignment of a short-circuit of a broadband lambda sensor.

The method begins in an optional step 100 with the heating of the sensor to a predetermined temperature of at least 500° C. For example, by the heating element 28 shown in FIG. 2. This heating can also take place during the operation of the sensor in which a short-circuit is then established which is to be assigned to a sensor line.

In step 102, a connection of all or only some sensor lines is established via the limiting resistor to the reference potential. For example, by closing the corresponding switch 62, 63, 64, 65.

In step 104, the sensor line potentials applied to the sensor line are compared to the upper or lower short-circuit potential, for example, by the upper or lower comparators 82, 83, 84, 85, 92, 93, 94, 95 (cf. FIG. 2A) or to the reference potential, for example, by the (reference potential) comparators 72, 73, 74, 75 (cf. FIG. 2B), respectively. If it is established upon the comparison that a sensor line potential on the sensor line deviates by at least a predetermined voltage amount from the upper or lower short-circuit potential (is thus outside the upper or lower short-circuit potential range), the connected sensor line is determined or classified in step 105 as "not short-circuited" (with the upper and the lower short-circuit potential, for example with a voltage supply or a ground).

According to a further alternative, the connected sensor line is determined or classified as short-circuited in step 105 (with the upper and the lower short-circuit potential, for example with a voltage supply or a ground) if it is established upon the comparison that a sensor line potential on the sensor line deviates by at least a predetermined voltage amount from the reference potential (is thus outside the reference potential range). In other words, the connected sensor line is classified as "not short-circuited" if the sensor line potential is inside the reference potential range.

In step 106, the connection established in step 102 is disconnected again after a predetermined time span, so that now none of the sensor lines is connected via the limiting resistor to the reference potential. For example, by opening the corresponding switch 62, 63, 64, 65. Step 104 (comparing) takes place at a point in time (checking point in time) within the time span, preferably toward the end of the time span.

Alternatively, this can also be carried out iteratively for the individual sensor lines, wherein it is then established in step 108 for this embodiment whether the sequence described in steps 102 (establishing a connection), 104 (comparing), 105 (classifying non-short-circuited sensor lines or determining whether or not a short-circuit of a sensor line is present), and 106 (disconnecting the connection) was already carried out at specified temperature, specified value of the limiting resistor, and specified reference potential for all sensor lines. If this is not the case, arrow 110, the sequence jumps back to step 102 again, wherein a sensor line for which steps 102, 104, 105, 106 were not yet executed is selected in step 102. On the other hand, if steps 102, 104, 105, 106 have already been executed for all sensor lines, arrow 112, the sequence continues with step 113.

In step 113, sensor lines not classified as not short-circuited are assigned to the short-circuit. For the case in which up to this point no short-circuited sensor line has been established, i.e., all sensor lines are classified as not short-circuited, the method ends.

Otherwise, it is checked in step 114, which applies to both variants, whether only a single one of the sensor lines was determined or classified as short-circuited in the preceding steps, i.e., was assigned to the short-circuit. If this is the case, arrow 116, the method can be ended in step 118 and it can be output which of the sensor lines is the single short-circuited sensor line.

If, on the other hand, it is determined in step 114 that two or more of the sensor lines were determined or classified as short-circuited (were assigned to the short-circuit), arrow 120, the sequence continues with step 122, in which at least one of the following changes is performed: the specified temperature is changed, the specified value of the limiting resistor is changed, the specified reference potential is changed.

These changes enable sensor lines to be recognized which are indirectly short-circuited (for example via the probe resistors). If, for example (cf. FIG. 2), the first sensor line 42 is short-circuited with the upper or the lower short-circuit potential, the second sensor line 43 is thus also indirectly short-circuited via the first probe resistor 22. If (in the context of steps 102, 104, 105) the switch 53 which is associated with the second sensor line 43 is closed, the first probe resistor 22 and the limiting resistor 66 form a voltage divider, wherein the potential is tapped between these two resistors by the comparator 73, which is associated with the second sensor line 43, and is compared to the reference potential. If the temperature is reduced, and thus the first probe resistor 22 is increased, and/or the limiting resistor 66 is reduced, the division ratio changes in such a way that the sensor line potential on the indirectly short-circuited second sensor line 43 is drawn in the direction of the reference potential, so that it ultimately comes to rest, when the change(s) is/are sufficient, outside the upper and/or lower short-circuit potential range or inside the reference potential range and accordingly is classified as not short-circuited in step 105. The sensor line potential on the first sensor line 42 does not change, in contrast, since it is directly short-circuited, thus no voltage divider is formed.

A similar effect can be achieved in that the reference potential is changed which can take place alternatively or additionally to the preceding changes. Due to this change, the reference potential range defined by the reference potential (and the voltage amount), which is between the upper and the lower short-circuit potential range, is shifted, so that with suitable change of the reference potential, the sensor line potential on the indirectly short-circuited sensor line comes to rest outside the upper/lower short-circuit potential range or inside the reference potential range, while the sensor line potential of the directly short-circuited sensor line is still inside the upper/lower short-circuit potential range or outside the reference potential range. In the preceding example, if the first sensor line 42 is, for example, short-circuited with a ground (i.e., with a lower short-circuit potential), the sensor line potential on the indirectly short-circuited second sensor line 43 will be somewhat above the ground potential (because of the voltage division). In this case, if a comparison to the reference potential takes place, the reference potential has to be reduced so that the lower limit of the reference potential range comes to rest around the reference potential between ground potential and sensor line potential on the second sensor line and accordingly the second sensor line is no longer determined to be short-circuited, while the first sensor line is still determined to be short-circuited. Upon short-circuit with an upper short-circuit potential (for example the voltage supply), the reference potential would accordingly have to be increased. If these sensor line potentials are compared, on the other hand, to the upper or lower short-circuit potential, the reference potential has to be changed in the other direction in each case.

The advantage of this step-by-step procedure described further hereinafter is that currents occurring during the method from the upper short-circuit potential to the reference potential or from the reference potential to the lower short-circuit potential can be kept as small as possible.

Furthermore, it can then be checked in step 124 whether, due to the at least one change, a predetermined minimum temperature is undershot, a predetermined minimum limiting resistor value is undershot, and/or a predetermined maximum range for the reference potential is left. Alternatively, it can be checked in step 124 whether a defined number of change steps 122 was carried out.

If this is the case, if thus a defined limit was undershot and/or a defined range was left due to the changes or a defined number has been reached, arrow 128, the method can be ended in step 130 and it can be output which of the sensor lines were determined or classified as short-circuited. On the other hand, if this is not the case, arrow 126, the sequence jumps back to step 102 again and the method is repeated starting therefrom with changed temperature, changed limiting resistor value, and/or changed reference potential.

During this repetition, all or preferably only the sensor lines recognized as short-circuited during the previous performance can again be checked using the changed boundary conditions.

The invention claimed is:

1. A method for line assignment of a short-circuit of a broadband lambda sensor (18) having an upper or a lower short-circuit potential, wherein the broadband lambda sensor has a sensor (20) and multiple sensor lines (42, 43, 44, 45), the method comprising
    establishing (102) a conductive connection of at least one sensor line of the multiple sensor lines via a limiting resistor (66) to a reference potential and disconnecting (106) the conductive connection after a predetermined time span, wherein a reference potential range defined around the reference potential is between an upper short-circuit potential range defined around the upper short-circuit potential and a lower short-circuit potential range defined around the lower short-circuit potential;
    comparing (104), within the predetermined time span, a sensor line potential of at least one sensor line to be checked of the multiple sensor lines to the reference potential;
    classifying (105), within the predetermined time span, the at least one sensor line to be checked as not short-circuited with the upper or the lower short-circuit potential when the comparison establishes that the at least one sensor line potential is within the reference potential range;
    comparing (104), within the predetermined time span, a sensor line potential of at least one sensor line to be checked of the multiple sensor lines to the upper and the lower short-circuit potential;
    classifying (105), within the predetermined time span, the at least one sensor line to be checked as not short-circuited with the upper or the lower short-circuit potential when the comparison establishes that the sensor line potential is outside the upper short-circuit potential range and outside the lower short-circuit potential range; and
    assigning the short-circuit to at least one sensor line not classified as not short-circuited.

2. The method according to claim 1, wherein the at least one sensor line to be checked includes one or more non-connected sensor lines.

3. The method according to claim 1, wherein the at least one sensor line to be checked includes all of the multiple sensor lines.

4. The method according to claim 1, comprising a repetition of the steps, wherein in the step of establishing (102) a conductive connection of at least one sensor line, other sensor lines are selected as the at least one sensor line.

5. The method according to claim 1, comprising, if the short-circuit is assigned to more than one sensor line, at least one of
    reducing the temperature of the sensor,
    reducing the limiting resistor, and
    changing the reference potential;
    and furthermore comprising
    repeating the method steps.

6. The method according to claim 1, comprising repeating the method steps until the short-circuit is assigned to precisely one sensor line.

7. An evaluation circuit for line assignment of a short-circuit of a broadband lambda sensor (18), which has a sensor (20) and multiple sensor lines (42, 43, 44, 55), the evaluation circuit comprising:
    a reference potential terminal (56);
    one sensor line terminal (52, 53, 54, 55) for each of the sensor lines;
    a limiting resistor (66), which is connected to the reference potential terminal;
    one switch (62, 63, 64, 65) for each of the sensor lines, wherein each of the switches is connected to the sensor line terminal for the respective sensor line and is connected via the limiting resistor to the reference potential terminal and is configured to establish, during a predetermined time span, or disconnect, after the predetermined time span, a connection via the limiting resistor between the respective sensor line terminal and the reference potential terminal; and
    a comparator (82, 83, 84, 85, 92, 93, 94, 95; 72, 73, 74, 75) connected to each of the sensor lines, which is configured to compare, within the predetermined time span, a sensor line potential applied on the respective sensor line to an upper short-circuit potential (88) applied on an upper short-circuit potential terminal (86) and/or a lower short-circuit potential (98) applied on a lower short-circuit potential terminal (96) and/or a reference potential (58) applied on the reference potential terminal (56).

8. The evaluation circuit according to claim 7, wherein the limiting resistor (66) is changeable.

9. A non-transitory, computer-readable storage medium containing instructions that when executed by a computer cause the computer to line assign a short-circuit of a broadband lambda sensor (18) having at least one of an upper or a lower short-circuit potential and multiple sensor lines (42, 43, 44, 45) by
    establishing (102) a conductive connection of at least one sensor line of multiple sensor lines via a limiting resistor (66) to a reference potential and disconnecting (106) the conductive connection after a predetermined time span, wherein a reference potential range defined around the reference potential is between an upper short-circuit potential range defined around the upper short-circuit potential and a lower short-circuit potential range defined around the lower short-circuit potential;

comparing (104), within the predetermined time span, a sensor line potential of at least one sensor line to be checked of the multiple sensor lines to the reference potential;

classifying (105), within the predetermined time span, the at least one sensor line to be checked as not short-circuited with the upper or the lower short-circuit potential when the comparison establishes that the at least one sensor line potential is within the reference potential range; and assigning the short-circuit to at least one sensor line not classified as not short-circuited.

10. A method for line assignment of a short-circuit of a broadband lambda sensor (18) having at least one of an upper or a lower short-circuit potential, wherein the broadband lambda sensor has a sensor (20) and multiple sensor lines (42, 43, 44, 45), the method comprising establishing (102) a conductive connection of at least one sensor line of the multiple sensor lines via a limiting resistor (66) to a reference potential, wherein a reference potential range defined around the reference potential is between an upper short-circuit potential range defined around the upper short-circuit potential and a lower short-circuit potential range defined around the lower short-circuit potential;

comparing (104), within a predetermined time span, a sensor line potential of at least one sensor line to be checked of the multiple sensor lines to the upper and the lower short-circuit potential;

classifying (105), within the predetermined time span, the at least one sensor line to be checked as not short-circuited with the upper or the lower short-circuit potential when the comparison establishes that the sensor line potential is outside the upper short-circuit potential range and outside the lower short-circuit potential range; and assigning the short-circuit to at least one sensor line not classified as not short-circuited.

* * * * *